US010117351B2

(12) United States Patent
Chen

(10) Patent No.: US 10,117,351 B2
(45) Date of Patent: Oct. 30, 2018

(54) CABLE MANAGEMENT ARM

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipei (TW)

(*) Notice: Subject to any disclaimer, the term of this patent is extended or adjusted under 35 U.S.C. 154(b) by 195 days.

(21) Appl. No.: 15/220,787

(22) Filed: Jul. 27, 2016

(65) Prior Publication Data

US 2018/0035563 A1 Feb. 1, 2018

(51) Int. Cl.
*H02G 3/04* (2006.01)
*H05K 7/14* (2006.01)

(52) U.S. Cl.
CPC ......... *H05K 7/1491* (2013.01); *H02G 3/0418* (2013.01)

(58) Field of Classification Search
CPC ...... H02G 3/0456; H02G 3/0418; H02G 3/26; H02G 3/30
USPC .. 248/58, 62, 65, 68.1, 70, 71, 72, 73, 74.1, 248/74.2, 74.4
See application file for complete search history.

(56) References Cited

U.S. PATENT DOCUMENTS

| 4,077,434 A * | 3/1978 | Sieckert | F16L 9/003 138/155 |
| 5,062,605 A * | 11/1991 | Muhlethaler | H02G 3/0443 248/243 |
| 5,597,980 A * | 1/1997 | Weber | H02G 3/0418 123/143 C |
| 6,154,927 A * | 12/2000 | Oi | F16C 11/10 16/342 |
| 6,771,871 B2 * | 8/2004 | Krampotich | G02B 6/4471 385/134 |
| 6,835,891 B1 * | 12/2004 | Herzog | H02G 3/0418 174/135 |
| 8,013,248 B2 * | 9/2011 | Sakata | H02G 3/0691 174/40 CC |
| 8,056,868 B2 * | 11/2011 | Vander Griend | E05D 1/02 24/455 |
| 8,366,059 B2 * | 2/2013 | Fannon | E05B 79/20 24/16 PB |

(Continued)

FOREIGN PATENT DOCUMENTS

TW I446666 7/2014

*Primary Examiner* — Terrell L McKinnon
*Assistant Examiner* — Michael McDuffie
(74) *Attorney, Agent, or Firm* — Rosenberg, Klein & Lee

(57) ABSTRACT

A cable management arm includes: a support arm having a connecting portion at both ends separately and at least one chute extended along the support arm; and at least one cable management box having a retaining portion on a side, and movably installed in the chute, and the cable management box including a main body and a cover, and a the main body has a cross-section being a U-shaped structure, and a first pivoting portion and a latching portion disposed at two end portions of an opening of the main body respectively, and the cover having a second pivoting portion corresponsive to the first pivoting portion for pivotally coupling the cover to the main body to cover the opening of the main body, and a locking means for adjusting the position of the cable management box with respect to the support arm all the time.

18 Claims, 6 Drawing Sheets

(56) References Cited

U.S. PATENT DOCUMENTS

| | | | | |
|---|---|---|---|---|
| 8,634,198 B2* | 1/2014 | Chen | ................... | H05K 7/1491 |
| | | | | 174/68.3 |
| 8,882,072 B2* | 11/2014 | Hattori | ................. | B29C 45/006 |
| | | | | 248/230.1 |
| 9,077,167 B2* | 7/2015 | Blanchard | .............. | H02G 3/263 |
| 9,402,329 B1* | 7/2016 | Chen | ......................... | F16L 3/08 |
| 9,863,388 B2* | 1/2018 | Rehwald | .............. | F02M 69/465 |
| 2006/0113433 A1* | 6/2006 | Chen | ................... | H05K 7/1491 |
| | | | | 248/70 |
| 2009/0236477 A1* | 9/2009 | Oh | ........................... | H02G 1/04 |
| | | | | 248/65 |
| 2010/0224738 A1* | 9/2010 | Bourgeois | ................ | H02G 3/30 |
| | | | | 248/70 |
| 2015/0089774 A1* | 4/2015 | Kalejaiye | ................. | H02G 3/32 |
| | | | | 24/122.3 |

* cited by examiner

CABLE MANAGEMENT ARM

FIELD OF THE INVENTION

The present invention relates to the field of accessories of an industrial computer rack, and more particularly to a cable management arm provided for accommodating or removing various types of signal lines or power cables quickly and conveniently.

BACKGROUND OF THE INVENTION

Description of the Related Art

As the communication technology advances, we often use 3C electronic products such as desktop computers, notebook computers, mobile phones and flat PCs to process different businesses for our daily life or work, and thus it brings tremendous opportunities to the business of electronic products. To store a large quantity of information, various industrial computer servers such as rack servers, blade servers or tower servers are developed to meet the e-requirements of the industry.

In general, an industrial computer rack comprises a cabinet and a plurality of servo hosts installed in the cabinet to save space and facilitate management, and also achieve the effect of executing a computation with a high computing volume by using the plurality of servo hosts. To facilitate the management including the maintenance, repair, and replacement of the servo host and provide a convenient operating space for maintenance personnel, the design of a rail is adopted, and a cable management arm moving along the rail is also developed to receive and store the signal line and power cable, so that the maintenance personnel can maintain, repair and replace the servo host in a short time.

At present, most cable management arms available in the market adopts a multi-stage support arm for a pivotal connection, and a design with swinging at the position of the pivotal connection provides the contracting and stretching effects, and the support arm is made of a metal sheet and bent into a U-shaped slot, and an end of the support arm is coupled to the rail or the servo host, so that when the servo host is moved outwardly, the cable management arm can be extended and stretched outwardly, so that the signal line or power cable will not be tangled.

However, the top side of the support arm is open, so that the cable may fall out easily from the top opening, even though this design has the advantage of storing the cable conveniently. When the cable management arm is in use, both ends of the support arm are pulled straight or bent to an extent that both ends are superimposed, so that the signal line or power cable accommodated in the cable management arm will be pulled straight or bent, and the signal line or power cable may be moved or deformed and fallen out from the top opening. In addition, the structure is made of metal and the weight of the assembly is relatively heavy, and such structure makes the application more difficult. Therefore, R.O.C. Pat. No. 1446666 entitled "Cable receiving device for a cable management arm" discloses a box-shaped cable receiving device comprising a receiving holder and a latch member pivotally coupled as a whole and capable of passing the signal line or power cable and limiting the moving position of the signal line or power cable, and the box-shaped cable receiving device not just reduces the volume and weight only, but also prevents the signal line or power cable from falling out. Since the elastic space is increased, the movement or deformation caused by pulling or bending the signal line or power cable becomes smaller.

Although the aforementioned cable receiving device for the cable management arm may overcome the problem of the conventional cable management arm, the cable receiving device is fixed to a specific position of the support arm, so that it is necessary to fine tune the hardness or flexibility for various different cable materials, and the conventional cable receiving device cannot provide an effective solution or a design capable of sliding the cable receiving device on the support arm or reaching the position for a fixed application to improve the convenience of use. Therefore, it is necessary to find a feasible solution to overcome the drawbacks of the conventional design and solve the longstanding problem of the conventional cable management arm.

SUMMARY OF THE INVENTION

Therefore, it is a primary objective of the present invention to provide a cable management arm, wherein a locking means is adopted to achieve the effect of locking or releasing a cable management box while performing a specific operation to improve the convenience and stability of the operation and use.

To achieve the aforementioned and other objectives, the present invention provides a cable management arm, comprising: a support arm, having a connecting portion disposed at both ends of the support arm separately, and at least one chute extended in a direction along the support arm; and at least one cable management box, having a retaining portion disposed on a side of the cable management box, and movably installed in the chute, and the cable management box including a main body and a cover, and the main body having a cross-section substantially being a U-shaped structure, and a first pivoting portion and a latching portion disposed at two end portions of an opening of the main body respectively, and the cover having a second pivoting portion configured to be corresponsive to the first pivoting portion for pivotally coupling the cover to the main body to cover the opening of the main body, and a locking means for adjusting the position of the cable management box with respect to the support arm all the time.

In an embodiment, the chute are formed by two parallel through holes, and the retaining portion has two opposite latches configured to be corresponsive to the pair of through holes respectively, and the two latches have a substantially L-shaped cross-section and the openings are formed opposite to each other. In addition, one of the latches is elastic to facilitate installation and operation. It is noteworthy that the support arm is corresponsive to the width of the cable management box and bent into a bow shape, and after the cable management box is installed to the support arm, the central axis of the cable management box is aligned linearly with the two end portions of the support arm. In addition, the support arm includes two chutes disposed with an interval apart from each other, and each chute is movably installed to at least one cable management box to improve the flexibility of use.

In an embodiment, different locking means are adopted to cope with different applications as follows.

1. If the locking means has at least one protrusion disposed at the external periphery of the second pivoting portion and corresponsive to the support arm, a locking effect will be achieved after the protrusion and the support arm interfere with each other. The locking means also meets the operating requirement according to the position of the protrusion. If the protrusion is situated at a position when the cover is closed to 0 degree, the locking effect will be achieved after the cover is closed. If the protrusion comes with a plural quantity and the two protrusions are situated at positions when the cover is opened to 90 degrees and closed to 0 degree, the locking effect will be achieved when the cover is opened and closed respectively.

2. The locking means includes at least one elastic bump disposed on a side of the cable management box opposite to the support arm, and the support arm has a plurality of positioning holes formed on a side of the support arm corresponsive to the elastic bump and disposed with an interval apart from one another, and a locking effect is achieved after one of the elastic bumps is latched to one of the positioning holes.

Due to the lightweight design, the present invention also takes the durability and service life in consideration and further comprises a reinforcing portion inwardly bent and formed at the top edge and the bottom edge of the support arm separately for increasing the structural strength of the support arm, so as to prevent the support arm from being deformed while the support arm is pulled straight or bent.

DESCRIPTION OF THE PREFERRED EMBODIMENTS

The above and other objects, features and advantages of this disclosure will become apparent from the following detailed description taken with the accompanying drawings.

Figure 1:
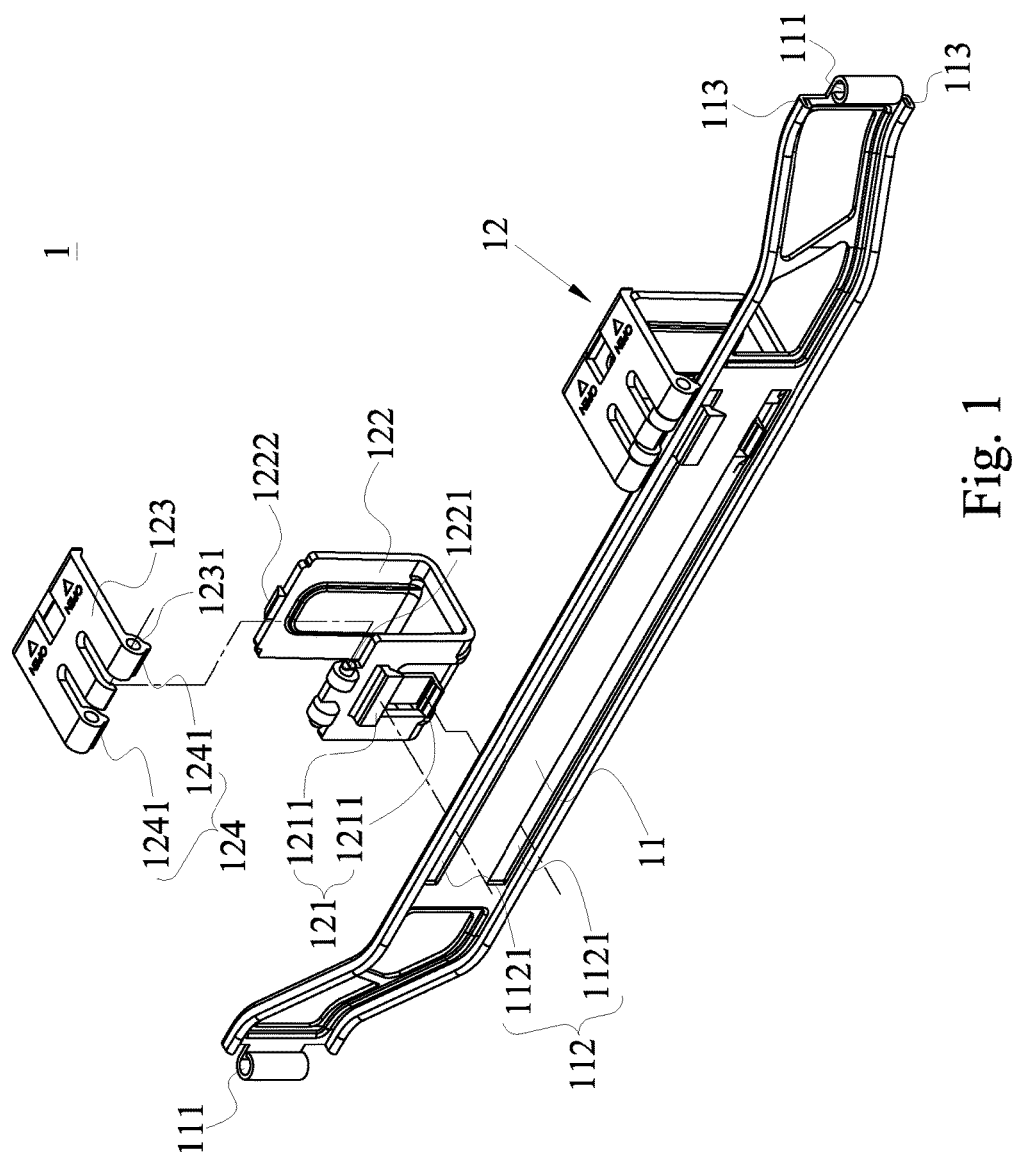
FIG. 1 is a schematic view of the structure of a preferred embodiment of the present invention.
Figure 2:
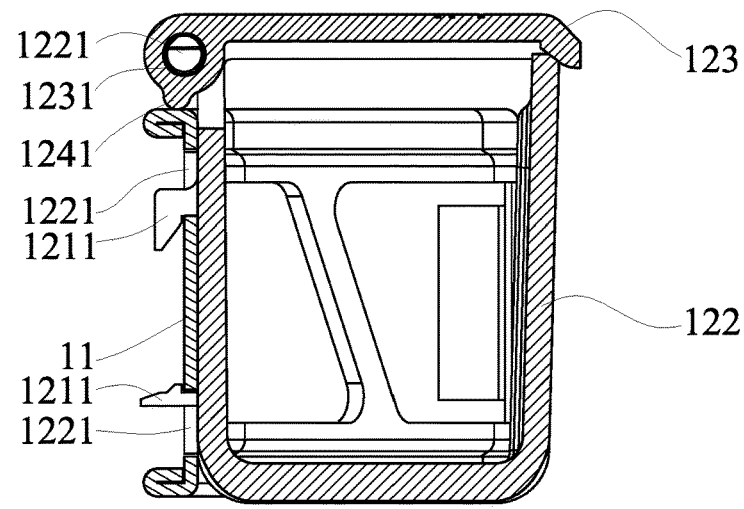
FIG. 2 is a first schematic view of an operating status of a preferred embodiment of the present invention.
Figure 3:
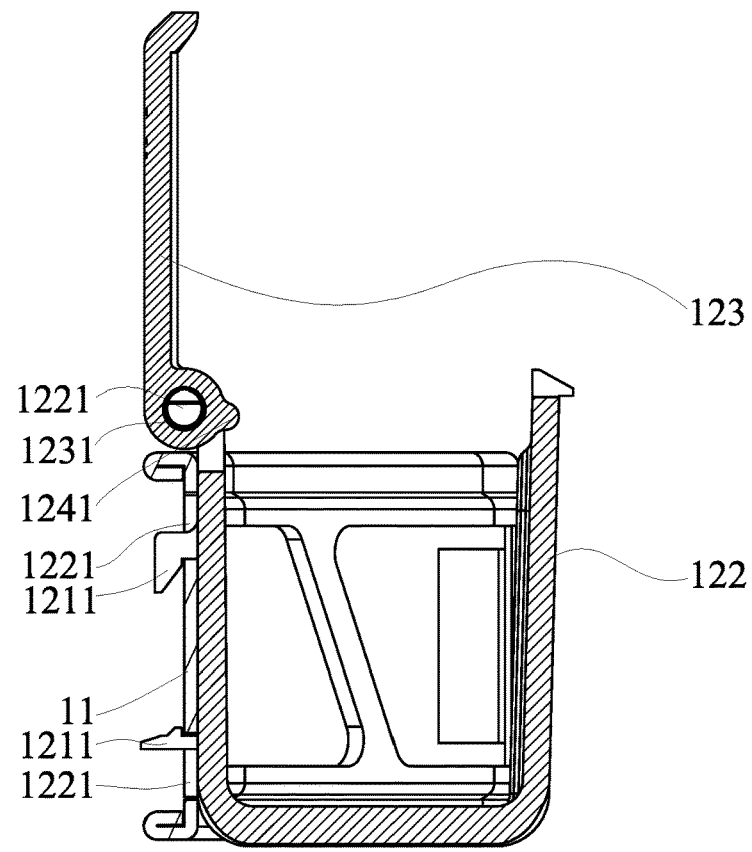
FIG. 3 is a second schematic view of an operating status of a preferred embodiment of the present invention.
Figure 4:
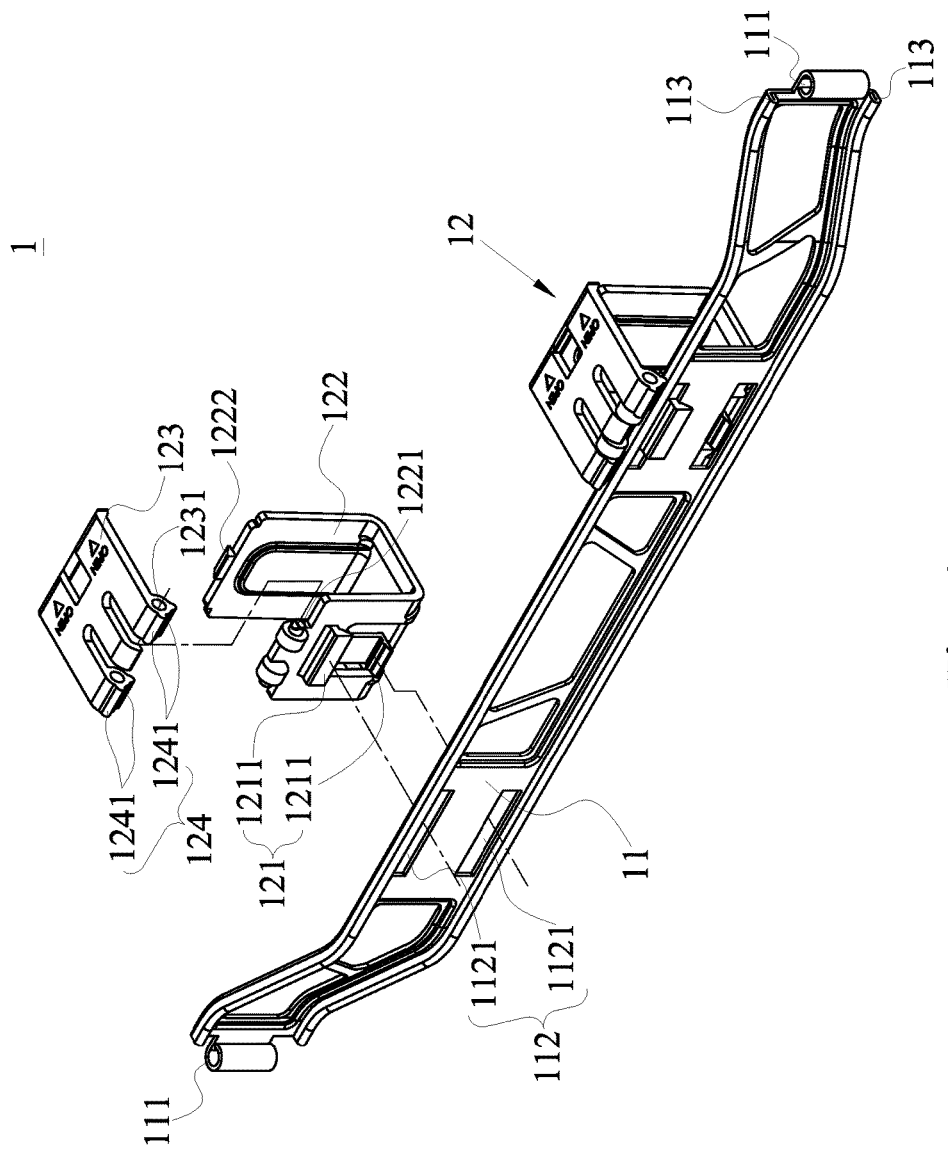
FIG. 4 is a schematic view of the structure of another preferred embodiment of the present invention.
Figure 5:
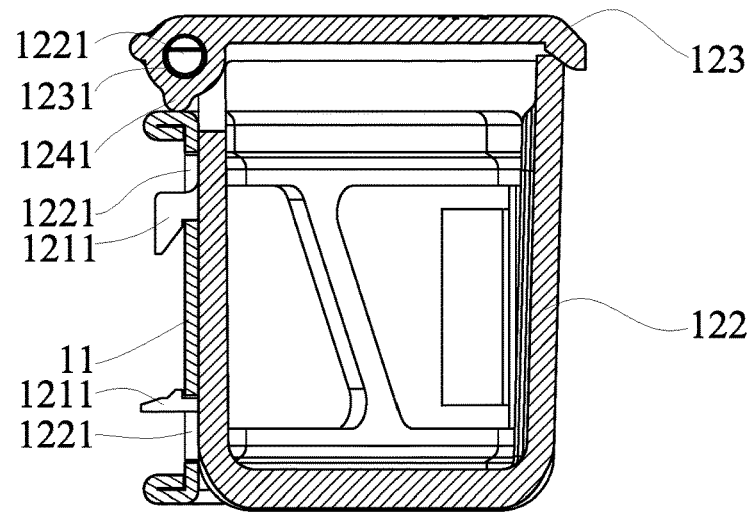
FIG. 5 is a first schematic view of an operating status of the other preferred embodiment of the present invention.
Figure 6:
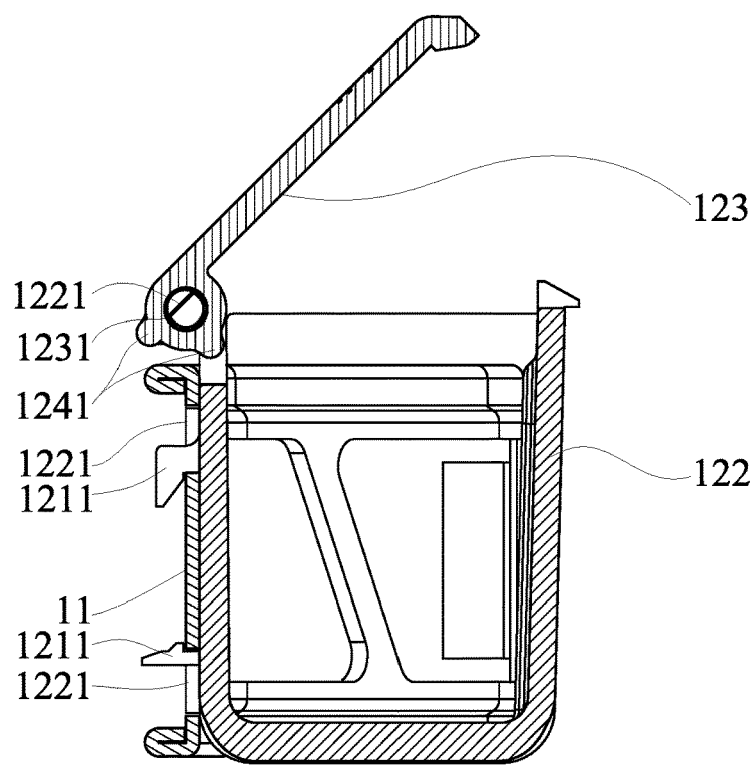
FIG. 6 is a second schematic view of an operating status of the other preferred embodiment of the present invention.
Figure 7:
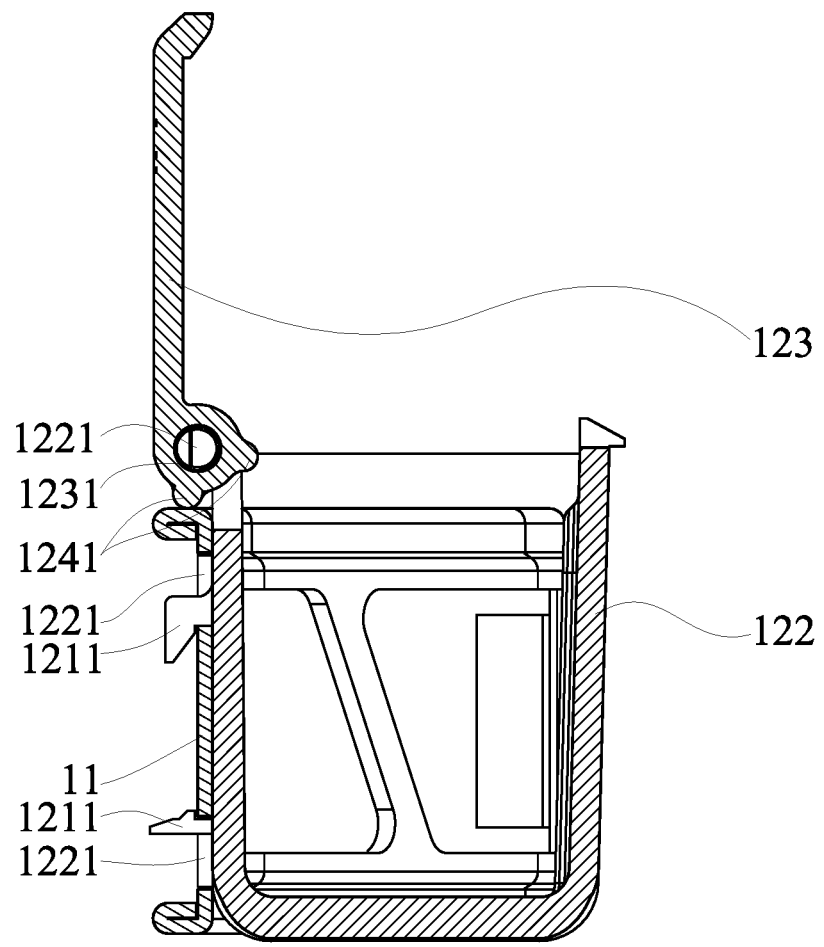
FIG. 7 is a third schematic view of an operating status of the other preferred embodiment of the present invention.

With reference to FIGS. 1 to 3 for the schematic views of the structure and its different operating statuses in accordance with a preferred embodiment of the present invention respectively, the present invention provides a cable management arm 1 comprising a plurality of support arms 11 and a plurality of cable management boxes 12.

Wherein, the support arm 11 has a connecting portion 111 disposed at both ends of the support arm 11 separately, and a chute 112 formed in the support arm 11 and extended in a direction along the support arm 11, and the chute 112 is comprised of two parallel through holes 1121. In addition, the support arm 11 further has a reinforcing portion 113 inwardly bent and formed at the top edge and the bottom edge of the support arm 11 separately to increase the structural strength of the support arm 11. It is noteworthy that each support arm 11 has a width corresponsive to the cable management box 12 and is bent into a bow shape, so that after the cable management box 12 is installed to the support arm 11, the central axis of the cable management box 12 is aligned linearly with the two end portions of the support arm 11 to prevent the cable from being tangled when it is exposed too much.

The cable management box 12 has a retaining portion 121 formed on a side of the cable management box 12 and movably installed in the chute 112, and the retaining portion 121 has two opposite latches 1211 configured to be corresponsive to the pair of through holes 1121 respectively, and the two latches 1211 have a substantially L-shaped cross section and the openings are opposite to each other, and one of the latch 1211 is elastic to facilitate installation and operation. In addition, the cable management box 12 includes a main body 122 and a cover 123, and the main body 122 has a cross section being a U-shaped structure and the main body 122 has a first pivoting portion 1221 and a latching portion 1222 disposed at two end portions of the opening of the main body 122 respectively, and the cover 123 has a second pivoting portion 1231 configured to be corresponsive to the first pivoting portion 1221 of pivotally coupling the cover 123 to the main body 122 to cover the opening. Further, the cable management box 12 includes a locking means 124 for adjusting the position of the cable management box 12 with respect to the support arm 11. In this embodiment, the locking means 124 has a protrusion 1241 disposed a the external periphery of the second pivoting portion 1221 and configured to be corresponsive to the support arm 11, and if the protrusion 1241 is situated at a position when the cover 123 is closed to 0 degree, and the cover 123 is closed, a locking effect will be achieved after the protrusion 1241 and the support arm 11 are interfered with each other. Maintenance personnel may close the cover 123 to achieve the locking effect after performing an operation or adjusting the position. After the cover 123 is opened, the position of the cable management box 12 with respect to the support arm 11 may be adjusted, so that the use and operation are very convenient.

With reference to FIGS. 4 and 5~7 for the schematic views of the structure and its different operating statuses in accordance with another preferred embodiment of the present invention respectively, the components of this embodiment are the same as those of the previous embodiment, and thus will not be repeated. However, the support arm 11 of this embodiment has two chutes 112 disposed with an interval apart with each other, and each chute 112 is movably installed to at least one cable management box 12. In addition, the locking means 124 has two protrusions 1241 disposed at the external periphery of the second pivoting portion 1221 and configured to be corresponsive to the support arm 11, and one of the protrusions 1241 is situated at a position when the cover 123 is opened to 90 degrees, and the other protrusion 1241 is situated at a position when the cover 123 is closed to 0 degree, so that the locking effect can be achieved when the cover 123 is opened or closed. Particularly, the cover 123 can be opened and fixed at a position of 90 degrees. In any position other than the aforementioned angle, the cable management box 12 can be situated at a released status, and its position can be adjusted to facilitate the operation that follows.

Figure 8:
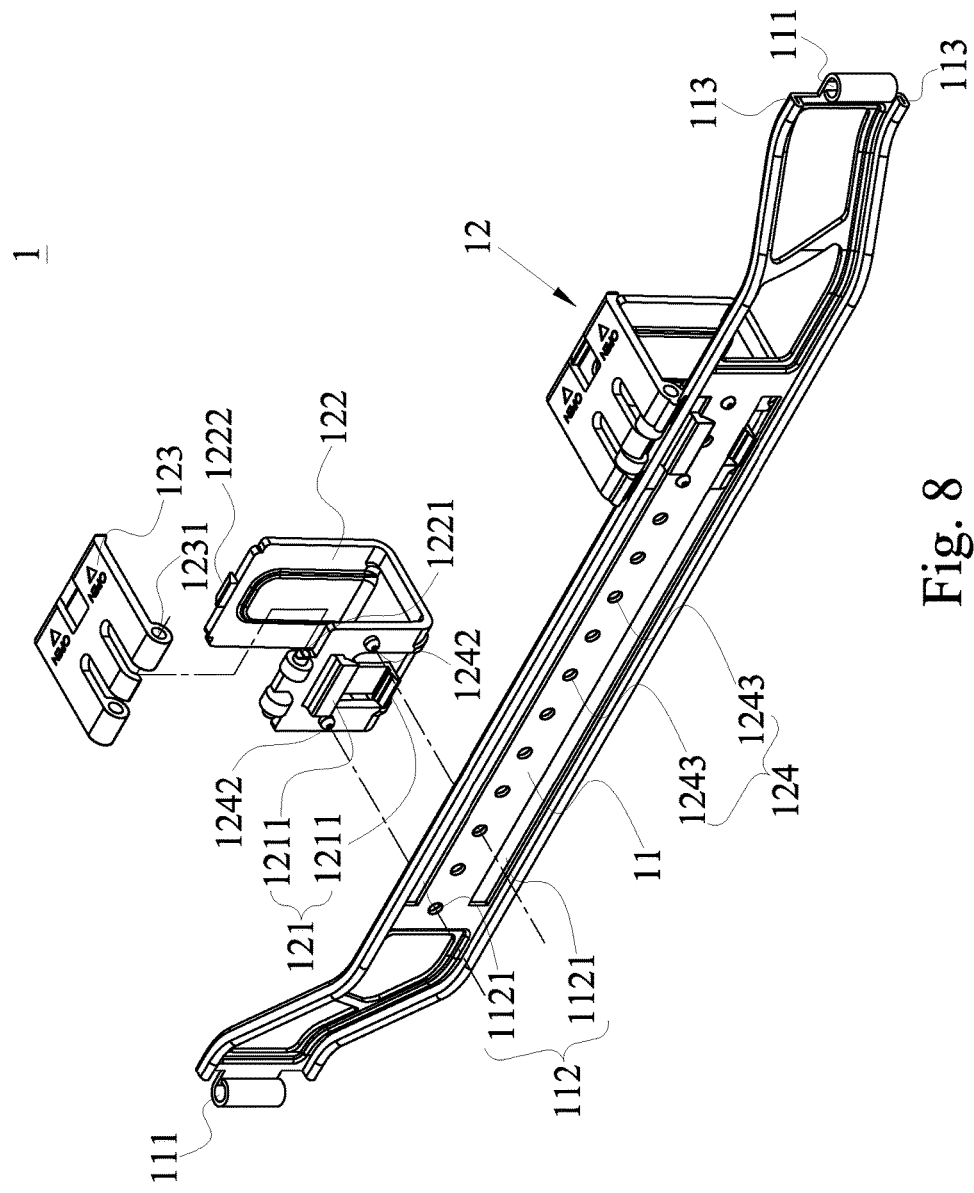
FIG. 8 is a schematic view of an operating status of a further preferred embodiment of the present invention.

With reference to FIG. 8 for a schematic view of the structure in accordance with a further preferred embodiment of the present invention, the components of this embodiment is the same as those of the previous two embodiments and thus will not be repeated. However, the locking means 124 of this embodiment has two elastic bumps 1242 formed on a side of the cable management box 12 and corresponsive to the support arm 11, and the support arm 11 has a plurality of positioning holes 1242 formed on a side of the support arm 11 and corresponsive to the two elastic bumps 1242 respectively, and the positioning holes 1243 are disposed with an interval apart from one another, and the pair of elastic bumps 1242 are latched into one of the pairs of positioning holes 1243 to achieve the locking effect. Although the operation of this embodiment is not as convenient as the previous two embodiments, yet the same locking effect can be achieved successfully. It is noteworthy that a hollowing process may be conducted at the surface of the support arms 11 of the aforementioned embodiments to reduce the weight of the support arm 11.

What is claimed is:

1. A cable management arm, comprising:
   a support arm, having a connecting portion disposed at both ends of the support arm separately, and at least one chute extended in a direction along the support arm; and
   at least one cable management box, having a retaining portion disposed on a side of the cable management box, and movably installed in the chute, and the cable management box including a main body and a cover, and the main body having a cross-section substantially being a U-shaped structure, and a first pivoting portion and a latching portion disposed at two end portions of an opening of the main body respectively, and the cover having a second pivoting portion configured to be corresponsive to the first pivoting portion for pivotally coupling the cover to the main body to cover the opening of the main body, and a locking means for adjusting the position of the cable management box with respect to the support arm all the time,
   wherein the locking means has at least one protrusion disposed at the external periphery of the second pivoting portion and corresponsive to the support arm, and a locking effect is achieved after the protrusion and the support arm interfere with each other,
   wherein the protrusion is disposed at a position when the cover is closed to 0 degree, and the locking effect is achieved after the cover is closed.

2. The cable management arm according to claim 1, wherein the chute are formed by two parallel through holes, and the retaining portion has two opposite latches configured to be corresponsive to the pair of through holes respectively, and the two latches have a substantially L-shaped cross-section and the openings are formed opposite to each other.

3. The cable management arm according to claim 2, wherein one of the latches is elastic to facilitate installation and operation.

4. The cable management arm according to claim 3, wherein the support arm is corresponsive to the width of the cable management box and bent into a bow shape, and after the cable management box is installed to the support arm, the central axis of the cable management box is aligned linearly with the two end portions of the support arm.

5. The cable management arm according to claim 4, wherein the support arm includes two chutes disposed with an interval apart from each other, and each chute is movably installed with at least one cable management box.

6. The cable management arm according to claim 1, wherein the locking means includes at least one elastic bump disposed on a side of the cable management box opposite to the support arm, and the support arm has a plurality of positioning holes formed on a side of the support arm corresponsive to the elastic bump and disposed with an interval apart from one another, and a locking effect is achieved after one of the elastic bumps is latched to one of the positioning holes.

7. The cable management arm according to claim 5, wherein the locking means includes at least one elastic bump disposed on a side of the cable management box opposite to the support arm, and the support arm has a plurality of positioning holes formed on a side of the support arm corresponsive to the elastic bump and disposed with an interval apart from one another, and a locking effect is achieved after one of the elastic bumps is latched to one of the positioning holes.

8. The cable management arm according to claim 1, wherein the support arm has a reinforcing portion inwardly bent and formed at the top edge and the bottom edge of the support arm separately for increasing the structural strength of the support arm.

9. The cable management arm according to claim 5, wherein the support arm has a reinforcing portion inwardly bent and formed at the top edge and the bottom edge of the support arm separately for increasing the structural strength of the support arm.

10. A cable management arm, comprising:
    a support arm, having a connecting portion disposed at both ends of the support arm separately, and at least one chute extended in a direction along the support arm; and
    at least one cable management box, having a retaining portion disposed on a side of the cable management box, and movably installed in the chute, and the cable management box including a main body and a cover, and the main body having a cross-section substantially being a U-shaped structure, and a first pivoting portion and a latching portion disposed at two end portions of an opening of the main body respectively, and the cover having a second pivoting portion configured to be corresponsive to the first pivoting portion for pivotally coupling the cover to the main body to cover the opening of the main body, and a locking means for adjusting the position of the cable management box with respect to the support arm all the time,
    wherein the locking means has at least one protrusion disposed at the external periphery of the second pivoting portion and corresponsive to the support arm, and a locking effect is achieved after the protrusion and the support arm interfere with each other,
    wherein if the protrusion comes with a plural quantity and the protrusions are situated at positions when the cover is opened to 90 degrees and closed to 0 degree, the locking effect will be achieved when the cover is opened and closed respectively.

11. The cable management arm according to claim 10, wherein the chute are formed by two parallel through holes, and the retaining portion has two opposite latches configured to be corresponsive to the pair of through holes respectively, and the two latches have a substantially L-shaped cross-section and the openings are formed opposite to each other.

12. The cable management arm according to claim 11, wherein one of the latches is elastic to facilitate installation and operation.

13. The cable management arm according to claim 12, wherein the support arm is corresponsive to the width of the cable management box and bent into a bow shape, and after the cable management box is installed to the support arm, the central axis of the cable management box is aligned linearly with the two end portions of the support arm.

14. The cable management arm according to claim 13, wherein the support arm includes two chutes disposed with an interval apart from each other, and each chute is movably installed with at least one cable management box.

15. The cable management arm according to claim 10, wherein the locking means includes at least one elastic bump disposed on a side of the cable management box opposite to the support arm, and the support arm has a plurality of positioning holes formed on a side of the support arm corresponsive to the elastic bump and disposed with an interval apart from one another, and a locking effect is achieved after one of the elastic bumps is latched to one of the positioning holes.

16. The cable management arm according to claim 14, wherein the locking means includes at least one elastic bump disposed on a side of the cable management box opposite to the support arm, and the support arm has a plurality of positioning holes formed on a side of the support arm corresponsive to the elastic bump and disposed with an interval apart from one another, and a locking effect is achieved after one of the elastic bumps is latched to one of the positioning holes.

17. The cable management arm according to claim 10, wherein the support arm has a reinforcing portion inwardly bent and formed at the top edge and the bottom edge of the support arm separately for increasing the structural strength of the support arm.

18. The cable management arm according to claim 14, wherein the support arm has a reinforcing portion inwardly bent and formed at the top edge and the bottom edge of the support arm separately for increasing the structural strength of the support arm.

* * * * *